(12) United States Patent
Fischer et al.

(10) Patent No.: US 12,129,567 B2
(45) Date of Patent: Oct. 29, 2024

(54) PLASMA TREATMENTS FOR FLEXURES OF HARD DISK DRIVES

(71) Applicant: HUTCHINSON TECHNOLOGY INCORPORATED, Hutchinson, MN (US)

(72) Inventors: Kurt F. Fischer, Eau Claire, WI (US); Alexander W. Haas, Hutchinson, MN (US); Matthew J. Horner, Savage, MN (US); Peter F. Ladwig, Hutchinson, MN (US); Carl C. Minton, Litchfield, MN (US); Paul V. Pesavento, Hutchinson, MN (US); David D. Smahel, Hutchinson, MN (US); Christopher J. Sperl, Hutchinson, MN (US); Darrell C. Sydlo, Hutchinson, MN (US); Ritesh K. Tiwari, Ellicott City, MD (US); Kyle T. Tobias, Hutchinson, MN (US); Maryam O. Yusuf, Chanhassen, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 15/148,034

(22) Filed: May 6, 2016

(65) Prior Publication Data

US 2016/0329067 A1    Nov. 10, 2016

Related U.S. Application Data

(60) Provisional application No. 62/157,819, filed on May 6, 2015.

(51) Int. Cl.
    *C25D 5/34*    (2006.01)
    *C23C 18/16*   (2006.01)
    (Continued)

(52) U.S. Cl.
    CPC ............ *C25D 5/34* (2013.01); *C23C 18/1653* (2013.01); *C25D 5/022* (2013.01); *C25D 7/00* (2013.01);
    (Continued)

(58) Field of Classification Search
    CPC . C25D 5/34; C25D 5/022; C25D 7/00; C25D 7/0614; C25D 7/0678; G11B 5/486;
    (Continued)

(56) References Cited

U.S. PATENT DOCUMENTS 4,278,493 A    7/1981 Petvai
6,022,805 A *  2/2000 Sumi ..................... C23C 14/165
                                                    204/192.32

(Continued)

FOREIGN PATENT DOCUMENTS

CN    1768558 A     5/2006
CN    102834545 A   12/2012
(Continued)

OTHER PUBLICATIONS

International Search Report and Written Opinion issued in PCT/US2016/031111, mailed Aug. 16, 2016, 11 pages.
(Continued)

*Primary Examiner* — Louis J Rufo
(74) *Attorney, Agent, or Firm* — DLA Piper LLP (US)

(57) ABSTRACT

Methods for producing flexible circuits can include creating treating a surface of the flexible circuit with at least one of an atmospheric plasma and a beam of ions. The atmospheric plasma is formed by directing a flow of gas between an electrode and the surface of the flexible circuit and generating a voltage between the electrode and the flexible circuit to create a plasma from the gas. A mean ion energy of the ions in the ion beam ranges from about 500 electron volts to about 1,500 electron volts.

9 Claims, 13 Drawing Sheets

(51) Int. Cl.
    *C25D 5/02*          (2006.01)
    *C25D 7/00*          (2006.01)
    *C25D 7/06*          (2006.01)
    *G11B 5/48*          (2006.01)
    *H01J 37/32*         (2006.01)
    *H05K 1/05*          (2006.01)
    *H05K 3/18*          (2006.01)

(52) U.S. Cl.
    CPC ......... *C25D 7/0614* (2013.01); *C25D 7/0678* (2013.01); *G11B 5/486* (2013.01); *H01J 37/32403* (2013.01); *H01J 37/32825* (2013.01); *H05K 1/053* (2013.01); *H05K 3/182* (2013.01); *G11B 5/484* (2013.01); *H05K 2203/0709* (2013.01); *H05K 2203/095* (2013.01)

(58) Field of Classification Search
    CPC ................ G11B 5/484; C23C 18/1653; H01J 37/32403; H01J 37/32825; H05K 1/053; H05K 3/182; H05K 2203/0709; H05K 2203/095
    See application file for complete search history.

(56) References Cited

U.S. PATENT DOCUMENTS

| | | | | |
|---|---|---|---|---|
| 6,095,084 | A * | 8/2000 | Shamouilian | C23C 16/00 118/723 E |
| 6,106,688 | A * | 8/2000 | Miyazaki | C25D 7/00 205/129 |
| 6,165,311 | A * | 12/2000 | Collins | B01D 53/22 156/345.26 |
| 6,841,737 | B2 * | 1/2005 | Komatsubara | G11B 5/4853 174/250 |
| 7,384,531 | B1 | 6/2008 | Peitoma et al. | |
| 7,643,252 | B2 | 1/2010 | Arai et al. | |
| 7,754,994 | B2 | 7/2010 | Yan et al. | |
| 7,875,804 | B1 * | 1/2011 | Tronnes | G11B 5/484 174/254 |
| 8,416,532 | B1 | 4/2013 | Miller et al. | |
| 8,809,688 | B2 | 8/2014 | Kim et al. | |
| 8,867,173 | B1 | 10/2014 | Roen | |
| 8,891,206 | B2 | 11/2014 | Miller | |
| 9,296,188 | B1 | 3/2016 | Cray et al. | |
| 2003/0164354 | A1 * | 9/2003 | Hsieh | H01J 37/32458 216/22 |
| 2003/0211649 | A1 * | 11/2003 | Hirai | H01L 27/283 438/48 |
| 2004/0011764 | A1 * | 1/2004 | De Vries | H01J 37/32009 216/63 |
| 2004/0045578 | A1 * | 3/2004 | Jackson | B08B 7/0021 134/1.2 |
| 2004/0161361 | A1 | 8/2004 | Uhm et al. | |
| 2006/0032049 | A1 | 2/2006 | Usui et al. | |
| 2009/0186167 | A1 * | 7/2009 | Tsuji | H05H 1/46 427/569 |
| 2010/0230135 | A1 | 9/2010 | Schreiber et al. | |
| 2012/0274273 | A1 | 11/2012 | Jacobs et al. | |
| 2012/0276791 | A1 | 11/2012 | Boetto et al. | |
| 2012/0291275 | A1 | 11/2012 | Rha et al. | |
| 2014/0374141 | A1 | 12/2014 | Yi et al. | |
| 2015/0303065 | A1 * | 10/2015 | Buckalew | H01L 21/0273 438/474 |
| 2015/0376792 | A1 * | 12/2015 | Spurlin | C25D 5/34 438/798 |
| 2016/0057867 | A1 * | 2/2016 | Yamauchi | H05K 1/056 29/850 |
| 2016/0141152 | A1 * | 5/2016 | Byrne | H01J 37/32825 156/345.55 |

FOREIGN PATENT DOCUMENTS

| | | | |
|---|---|---|---|
| DE | 10321889 A1 * | 12/2004 | ............... B08B 6/00 |
| EP | 0 478 975 A2 | 4/1992 | |
| JP | H02-47893 A | 2/1990 | |
| JP | 11-92579 A | 4/1999 | |
| JP | 2000185362 A * | 7/2000 | |
| JP | 2001-209918 A | 8/2001 | |
| JP | 2003-045871 A | 2/2003 | |
| JP | 2003-203436 A | 7/2003 | |
| JP | 2004-174904 A | 6/2004 | |
| JP | 2004-186598 A | 7/2004 | |
| JP | 2006-500782 A | 1/2006 | |
| JP | 2015-40324 A | 3/2015 | |

OTHER PUBLICATIONS

International Preliminary Report on Patentability in International Application No. PCT/US2016/031111, mailed Nov. 16, 2017.
First Office Action in Chinese Patent Application No. 201680035848.5 dated Oct. 22, 2019.
Notice of Reasons for Refusal in Japanese Patent Application No. 2017-558017 dated Jan. 21, 2020.
Office Action in Chinese Application No. 201680035848.5, dated Sep. 28, 2020.
Notice of Granting Patent Right for Invention in Chinese Application No. 201680035848.5, dated Mar. 29, 2021.

* cited by examiner

PLASMA TREATMENTS FOR FLEXURES OF HARD DISK DRIVES

CROSS-REFERENCE TO RELATED APPLICATION

This application claims priority to Provisional Application No. 62/157,819, filed May 6, 2015, which is herein incorporated by reference in its entirety.

TECHNICAL FIELD

The present invention relates to plasma treatments in the manufacture of flexible circuits. More specifically, the invention relates to plasma treatments for flexures of hard disk drives.

BACKGROUND

Flexible circuits typically include layers of conductors and layers of insulation which may separate at least parts of the layers of conductors and may provide environmental protection for the conductors. Flexures are structures that flexibly support a read/write transducer proximate a rotating disk, while also supporting flexible electrical circuitry for conducting electrical signals to and from the transducer. A desire for ever smaller and higher-density disk drives has driven a need for smaller flexures with smaller features. As the flexures become smaller, providing smaller, low-resistance electrical connections between the conductive layers and ensuring good adhesion between the various conductive and insulative layers of the flexure may become more challenging.

SUMMARY

Various embodiments concern methods of producing a flexible circuit. Such methods can include treating a surface of the flexible circuit with an atmospheric plasma. The atmospheric plasma is formed by directing a flow of gas between an electrode and the surface of the flexible circuit and generating a voltage between the electrode and the flexible circuit to create a plasma from the gas.

In some embodiments in which the flexible circuit includes a flexible metal substrate and a dielectric polymer layer disposed on the metal substrate, the method can further include forming at least one opening in the dielectric polymer layer to expose a portion of a surface of the metal substrate, treating the exposed portion of the surface of the metal substrate with the atmospheric plasma to remove contaminants from the exposed portion of the metal substrate, depositing a seed layer on the dielectric polymer layer and the treated surface of the metal substrate, and forming a plurality of conductive traces on the seed layer, wherein at least one of the conductive traces extends to the treated surface of the metal substrate to form an electrical contact between the conductive trace and the metal substrate.

In some embodiments, in which the flexible circuit includes a flexible metal substrate and a dielectric polymer layer disposed on the metal substrate, the method can further include depositing a seed layer on the dielectric polymer layer, covering a portion of the seed layer with a patterned photoresist layer, electroplating a conductive metal onto portions of the seed layer not covered by the photo resist layer to form a plurality of conductive traces, stripping away the patterned photoresist layer to expose the portion of the seed layer, etching away the exposed portion of the seed layer to expose a portion of a surface of the dielectric polymer layer, and treating the exposed portion of the surface of the dielectric polymer layer with the atmospheric plasma, wherein the atmospheric plasma removes conductive contaminants from the exposed portion of the surface of the dielectric polymer layer between adjacent conductive traces. Such methods can further include plating another conductive metal onto the plurality of conductive traces by electroless plating.

In some embodiments, in which the flexible circuit includes a flexible metal substrate, a dielectric polymer layer disposed on the flexible metal substrate, and a plurality of conductive traces disposed on the dielectric polymer layer, the method can further include treating a surface of the dielectric polymer layer with the atmospheric plasma in which the atmospheric plasma functionalizes the surface of the dielectric polymer layer, and forming a dielectric polymer coating covering the plurality of conductive traces and a portion of the functionalized surface of the dielectric polymer layer adjacent to each of the plurality of conductive traces.

In some embodiments, in which the flexible circuit includes a flexible metal substrate, a dielectric polymer layer disposed on the metal substrate, a seed layer, and a plurality of conductive traces disposed on the seed layer, the method can further include forming at least one opening through the flexible metal substrate on a side opposite the dielectric polymer layer, etching the dielectric polymer layer through the at least one opening to expose a portion of a surface of the seed layer of one of the plurality of conductive traces, and treating the exposed portion of the surface of the seed layer with the atmospheric plasma, wherein the atmospheric plasma removes contaminants from the exposed portion of the surface of the seed layer to enable formation of an electrical connection to the conductive trace.

In some embodiments, the gas consists essentially of oxygen. In some embodiments, the flexible circuit is produced by web processing and the surface of the flexible circuit is treated with the atmospheric plasma as the flexible circuit moves through the atmospheric plasma.

Various embodiments concern methods of producing a flexible circuit, the methods including treating a surface of the flexible circuit with a beam of ions, wherein a mean ion energy of the ions ranges from about 500 electron volts to about 1,500 electron volts.

In some embodiments, in which the flexible circuit includes a flexible metal substrate and a dielectric polymer layer disposed on the metal substrate, the method can further include forming at least one opening in the dielectric polymer layer to expose a portion of a surface of the metal substrate, treating the exposed portion of the surface of the metal substrate and a surface of the dielectric polymer layer with the ion beam in which the ion beam removes contaminants and native oxides from the exposed portion of the surface of the metal substrate and modifies the surface of the dielectric polymer layer to form a graphite-like layer, depositing a seed layer on the graphite-like layer and the treated surface of the metal substrate, and forming a plurality of conductive traces on the graphite-like layer, wherein at least one of the conductive traces extends to the treated surface of the metal substrate to form an electrical contact between the conductive trace and the metal substrate.

In such embodiments, the mean ion energy of the ions can range from about 1,000 electron volts to about 1,500 electron volts. In such embodiments, forming the plurality of conductive traces on the graphite-like layer can includes covering a portion of the seed layer with a patterned photoresist layer, electroplating a first conductive metal onto portions of the seed layer not covered by the photo resist layer to form a plurality of conductive traces, stripping away the patterned photoresist layer to expose the portion of the seed layer, etching away the exposed portion of the seed layer to expose a portion of the graphite-like layer, and treating the exposed portion of the graphite-like layer with an oxygen plasma, wherein the oxygen plasma at least one of removes at least a portion of the graphite-like layer and oxidizes the graphite-like layer between adjacent conductive traces. Such methods may further include plating another conductive metal onto the plurality of conductive traces by electroless plating. In such embodiments, the oxygen plasma can be an atmospheric oxygen plasma, the atmospheric oxygen plasma formed by directing a flow of oxygen between an electrode and the surface of the flexible circuit, and generating a voltage between the electrode and the metal substrate to create a plasma from the oxygen.

In such embodiments, the method can further include forming at least one opening through the metal substrate on a side opposite the dielectric polymer layer, etching the dielectric polymer layer through the at least one opening to expose a portion of a surface of the seed layer of one of the plurality of conductive traces, and treating the exposed portion of the surface of the seed layer with the atmospheric plasma, wherein the atmospheric plasma removes contaminants from the exposed portion of the surface of the seed layer to enable formation of an electrical connection to the conductive trace.

In some embodiments, the ions consist essentially of at least one of argon ions and nitrogen ions. In some embodiments, the dielectric polymer layer is a polyimide layer. In some embodiments, the flexible circuit is a flexure of a hard disk drive. In some embodiments, the flexible circuit is produced by web processing and the surface of the flexible circuit is treated with the ion beam as the flexible circuit moves through the ion beam.

Various embodiments concern methods of producing a flexible circuit, the methods including treating a surface of the flexible circuit with an atmospheric plasma and with a beam of ions. The atmospheric plasma is formed by directing a flow of gas between an electrode and the surface of the flexible circuit and generating a voltage between the electrode and the flexible circuit to create a plasma from the gas. A mean ion energy of the ions in the ion beam ranges from about 500 electron volts to about 1,500 electron volts. The flexible circuit is produced by web processing and the surface of the flexible circuit is treated with the atmospheric plasma as the flexible circuit moves through the atmospheric plasma and is treated with the ion beam as the flexible circuit moves through the ion beam.

While multiple embodiments are disclosed, still other embodiments of the present invention will become apparent to those skilled in the art from the following detailed description, which describes illustrative embodiments of the invention. Accordingly, the detailed description is to be regarded as illustrative in nature and not restrictive.

Figure 1:
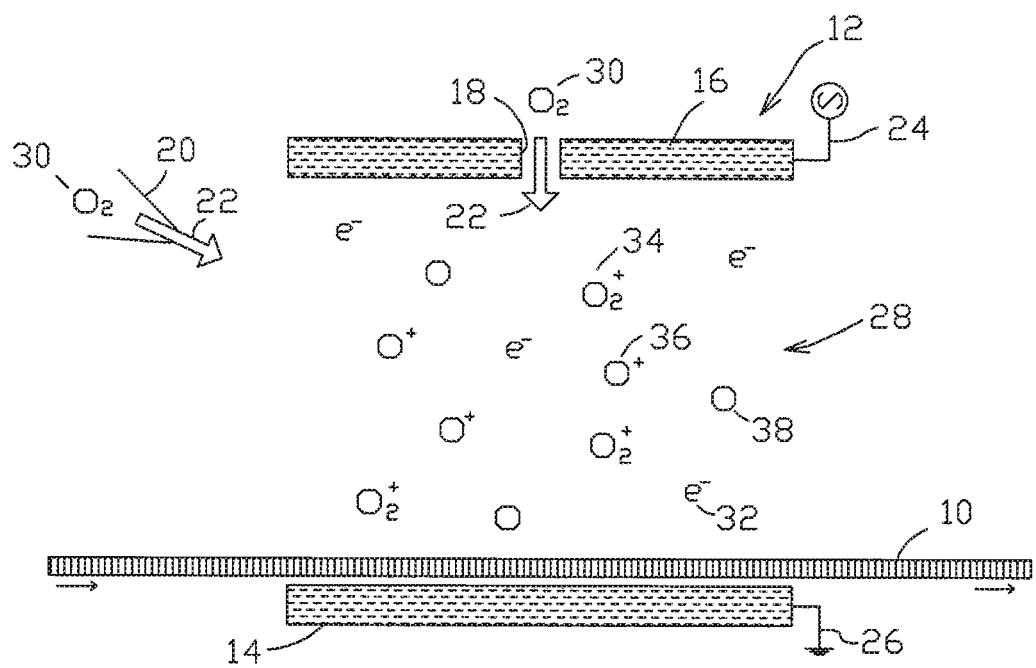
FIG. 1 shows a schematic cross-sectional view of a web containing flexible circuits treated by an atmospheric plasma, according to some embodiments.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DETAILED DESCRIPTION

Embodiments described below disclose plasma cleaning and treatment processes and their use in the production flexible circuits. In some embodiments, the flexible circuits are flexures of a hard disk drive suspension, such as a suspension of any of U.S. Pat. Nos. 9,296,188 and 8,891,206, both of which are hereby incorporated by reference in their respective entireties.

FIG. 1 shows a schematic cross-sectional view of a web containing flexible circuits treated by an atmospheric plasma (also called an atmospheric pressure plasma), according to some embodiments. FIG. 1 shows a web 10 moving through an atmospheric plasma system 12. The web 10 includes a plurality of flexible circuits (not shown in FIG. 1), such as flexible circuit 40 (FIGS. 2-11) or flexible circuit 122 (FIGS. 13-23). The web 10 can move through the atmospheric plasma system 12 at any speed necessary to producing a dwell time within the atmospheric plasma suitable for a particular plasma cleaning or treatment, with slower speeds resulting in longer dwell times and longer a plasma cleaning or treatment for any particular flexible circuit. The atmospheric plasma system 12 includes a first electrode 14, a second electrode 16, and gas ports 18 and 20. The first electrode 14 can be a plate above which the web 10 travels in close proximity or a roller in physical contact with the web 10 to support the web 10 and/or to propel the web through the atmospheric plasma system 12. The second electrode 16 is disposed distal from the web 10. In some embodiments, the second electrode 16 is disposed about 0.04 inches from the web 10.

The gas port 18 penetrates the second electrode 16 to provide a flow of gas to a space between the second electrode and the web 10. The gas port 20 is separate from the second electrode 16 and is oriented to provide a flow of gas to the space between the second electrode and the web 10. While the atmospheric plasma system 12 of FIG. 1 includes both the gas port 18 and the gas port 20, in some embodiments, the atmospheric plasma system 12 may include only the gas port 18 or the gas port 20.

In operation, while the web 10 moves through the atmospheric plasma system 12, the gas port 18 and/or the gas port 20 direct a flow of gas 22 between the second electrode 16 and the web 10. In the embodiment shown in FIG. 1, the second electrode 16 is electrically connected to an alternating voltage source 24 to provide an alternating voltage to the second electrode 16, while the first electrode 14 is electrically connected to a ground 26. In some embodiments, the web 10 is also electrically connected to ground 26 by contact with the first electrode 14. The potential voltage difference thus produced between the first electrode 14 and the second electrode 16 is sufficient to ionize the gas and generate an atmospheric plasma 28 between the web 10 and the second electrode 16. In the atmospheric plasma 28, reactive species can be formed from the gas. Some of the reactive species may be produced by stripping away an electron, resulting in a positively charged reactive ion. In some embodiments, the atmospheric plasma 28 can be at a positive voltage compared to the first electrode 14, producing an electric field that will accelerate the charged reactive ions toward the web 10 to clean and/or treat the flexible circuits included therein.

Ion bombardment energies of ions in the atmospheric plasma 28 may be a function of, for example, the power applied to the second electrode 16 and a flow rate of the flow of gas 22. In some embodiments, the ion bombardment energy of the ions may range from about 1 electron volt (eV) to about 100 eV, power may range from about 1,000 watts to about 4,000 watts, and gas flow rates may range from about 10 liters per minutes to about 20 liters per minute.

Although the alternating voltage source 24 is configured to provide the alternating voltage to the second electrode 16 while the first electrode 14 is electrically connected to a ground 26 in the embodiment shown in FIG. 1, in other embodiments, the alternating voltage source 24 may be configured to provide the alternating voltage between the first electrode 14 and the second electrode 16.

In the embodiment shown in FIG. 1, the gas consists essentially of oxygen 30 in diatomic form ($O_2$). By consists essentially of oxygen 30, it is meant that the gas supplied to the chamber is pure oxygen which may include negligible amounts of impurities, such as water vapor, nitrogen, carbon dioxide, etc., which do not have a material effect on the efficacy of the plasma cleaning or treatment. Once in the space between the web 10 and the second electrode 16, electrons 32 are separated from the oxygen 30 producing the atmospheric plasma 28. The atmospheric plasma 28 includes a number of reactive species including diatomic ions 34, monatomic ions 36, and monatomic oxygen 38. The atmospheric plasma 28 can be at a positive voltage compared to the first electrode 14, producing an electric field that will accelerate the positive diatomic ions 34 and the monatomic ions 36 toward the web 10 to clean and/or treat the flexible circuits moving past on the web 10.

The web 10 is free to move easily through the atmospheric plasma system 12, without delays for pump down and vent a vacuum chamber or an airlock. However, because the atmospheric plasma system 12 operates at atmospheric pressure and without a pressure vessel, a generally immaterial amount of the surrounding atmosphere may enter the plasma, for example, as a boundary layer carried along the web. Thus, although the flow of gas directed at the chamber may consist essentially of oxygen, the atmospheric plasma 28 itself may include detectable quantities of atmospheric gases.

Although the embodiment of FIG. 1 is shown using a gas consisting essentially of oxygen, it is understood that other embodiments may employ a gas including mixtures of oxygen, nitrogen, hydrogen, any of the noble gases, or any of the halogens in any suitable combinations and ratios.

Figure 2:
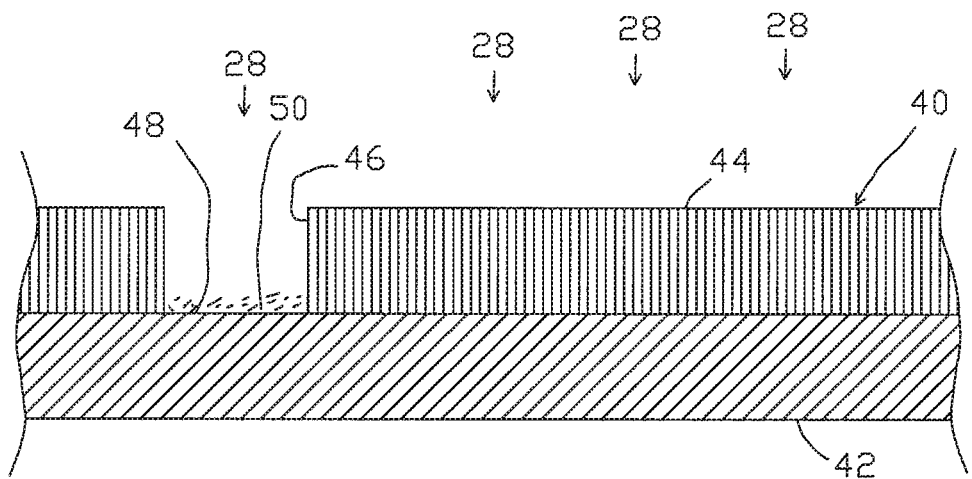
FIG. 2 is a cross-sectional view of a portion a flexible circuit showing at least one opening in a dielectric polymer layer, according to some embodiments.

FIG. 2 is a cross-sectional view of a portion a flexible circuit showing at least one opening in a dielectric polymer layer, according to some embodiments. FIG. 2 shows flexible circuit 40 including metal substrate 42, dielectric polymer layer 44, and opening 46. The metal substrate 42 can be a flexible metal substrate. In some embodiments, for example, where the flexible circuit 40 is a flexure, the metal substrate 42 can be stainless steel. In other flexure embodiments, the metal substrate 42 can be other types of metals, such as copper, phosphorus bronze, or nitinol. The dielectric polymer layer 44 can be made of any suitable, curable polymer, such as a polyimide. The dielectric polymer layer 44 is disposed on a surface 48 of the metal substrate 42. The opening 46 is an opening in the dielectric polymer layer 44 that extends through the dielectric polymer layer 44 to expose a portion of the surface 48. The opening 46 may be used to establish an electrical connection between a conductive trace formed on the dielectric polymer layer 44 (conductive trace 56a, FIG. 5) and the metal substrate 42. In some embodiments, the dielectric polymer layer 44 may be formed by deposition of a photoimageable polyimide precursor onto the surface 48, followed by photolithographic processes well known in the art, including exposing the polyimide precursor through a photomask and developing to form the opening 46. Once the opening 46 is formed, the polyimide precursor is cured to form the polyimide.

As shown in FIG. 2, the opening 46 can include a contamination 50 on the exposed portion of the surface 48. The contamination 50 may include, for example, residue of the polyimide precursor remaining after the photolithographic processes or byproducts from the polyimide curing that deposit on the surface 48. It has been found that, if not removed, the contamination 50 may increase the resistance of an electrical connection between a conductive trace formed on the dielectric polymer layer 44 (conductive trace 56a, FIG. 5) and metal substrate 42. Thus, after the opening 46 is formed, the exposed portion of the surface 48 of the metal substrate 42 is treated with the atmospheric plasma 28 described above in reference to FIG. 1 to remove at least some of the contamination 50.

In some embodiments, the treatment with the atmospheric plasma 28 to remove the contamination 50 can be done at a power of about 2,000 watts and a gas flow rate of about 15 liters per minute consisting essentially of oxygen, with a dwell time of the flexible circuit 40 in the atmospheric plasma 28 of about 5 seconds. Limiting the energy and exposure time may remove the contamination 50 without damaging the dielectric polymer layer 44.

Figure 3:
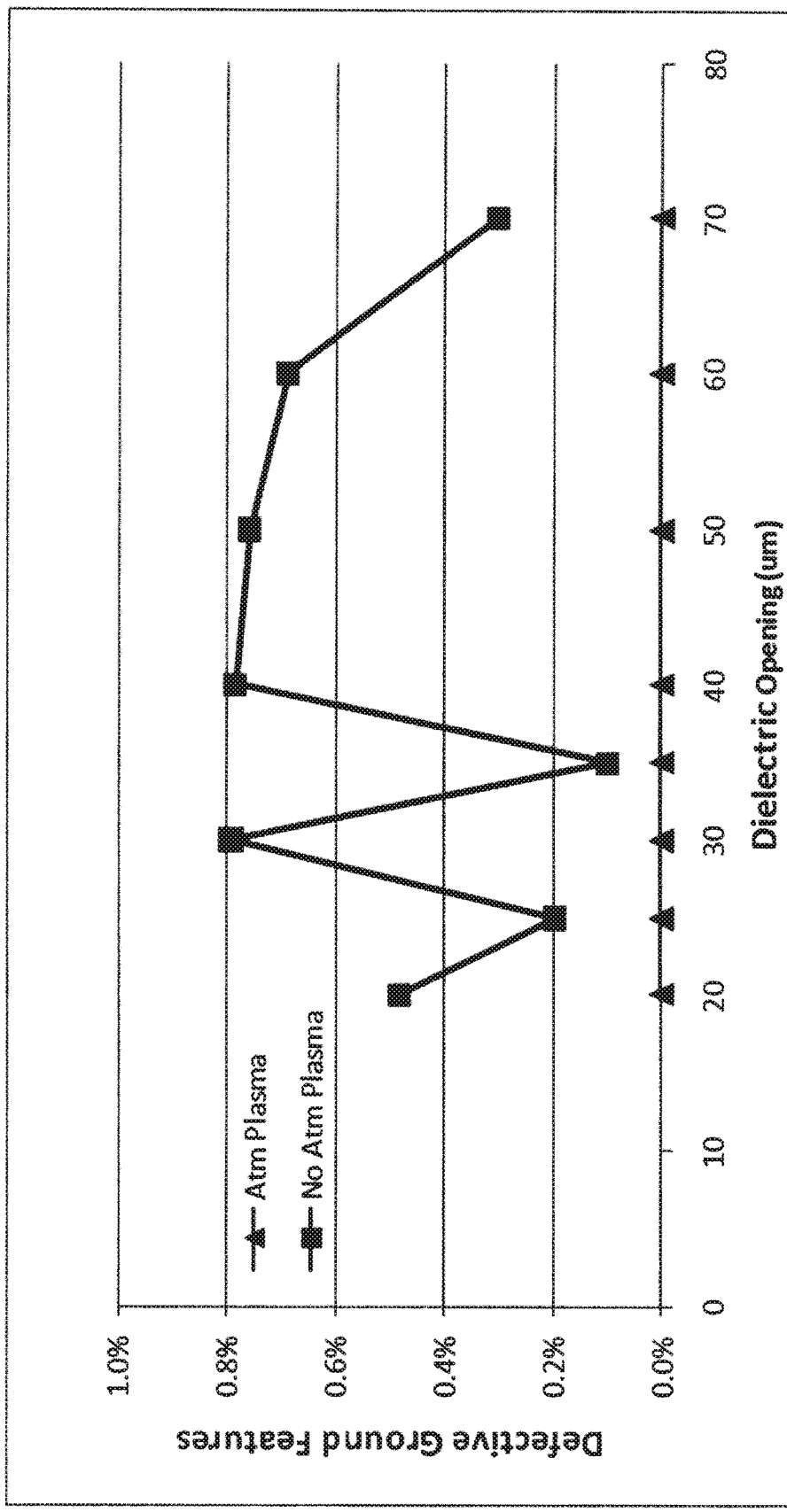
FIG. 3 is a graph of defective ground feature rates as a function of a dielectric opening size of the ground feature with and without treatment with the atmospheric plasma, according to some embodiments.

FIG. 3 is a graph of defective ground feature rate as a function of a dielectric opening size of the ground feature with and without treatment with the atmospheric plasma 28 according to embodiments described above in reference to FIG. 2. A ground feature is an electrical connection between a conductive trace formed on the dielectric polymer layer 44 and the metal substrate 42. As shown in FIG. 3, use of the atmospheric plasma 28 dramatically reduces the rate of ground feature defects, and does so at for opening 46 sizes ranging from 20 microns to 70 microns.

Figure 4:
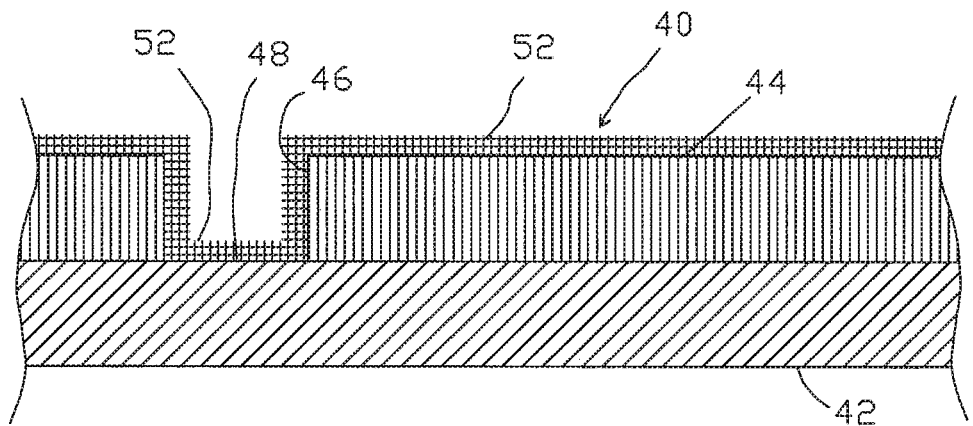
FIG. 4 is a cross-sectional view of the portion of the flexible circuit shown in FIG. 3 after deposition of a seed layer, according to some embodiments.

FIG. 4 is a cross-sectional view of the portion of the flexible circuit 40 showing additional processing after the processing described above in reference to FIG. 2, in some embodiments. FIG. 4 shows a seed layer 52 deposited onto the dielectric layer 44 and the exposed portion of the surface 48 of the metal substrate 42 after the exposed portion of the surface 48 was treated with the atmospheric plasma 28 to remove the contamination 50. With the contamination 50 removed, the seed layer 52 is able to form a low resistance electrical connection with the metal substrate 42. The seed layer 52 may be formed, for example, by sputter deposition of a chromium layer onto the dielectric layer 44 and the exposed portion of the surface 48 of the metal substrate 42, followed by sputter deposition of a copper layer onto the chromium layer.

Figure 5:
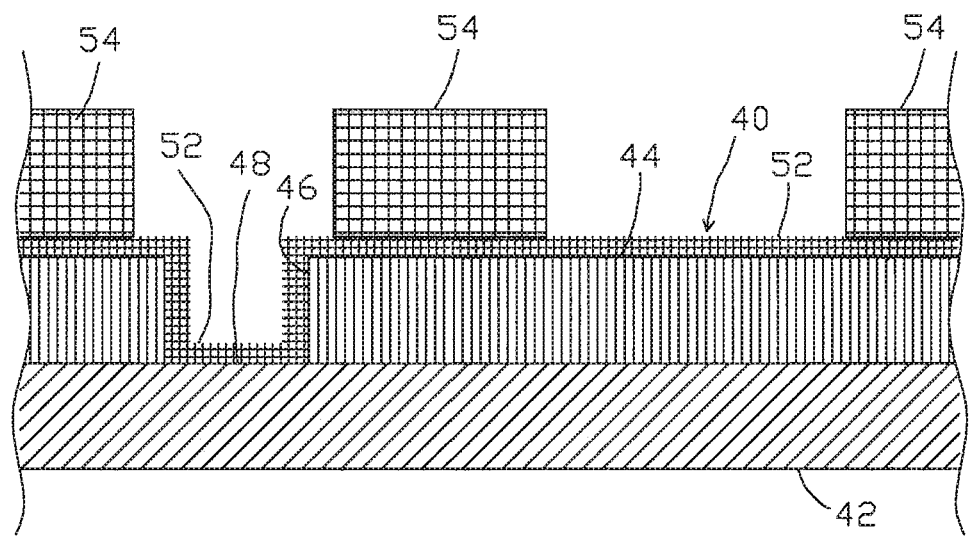
FIG. 5 is a cross-sectional view of the portion of the flexible circuit shown in FIG. 4 after formation of a patterned photoresist layer, according to some embodiments.

FIG. 5 is a cross-sectional view of the portion of the flexible circuit 40 showing additional processing after the processing described above in FIG. 4, in some embodiments. FIG. 5 shows a patterned photoresist layer 54 formed on the seed layer 52. The patterned photoresist layer 54 can be formed by photolithographic techniques well known in the art.

Figure 6:
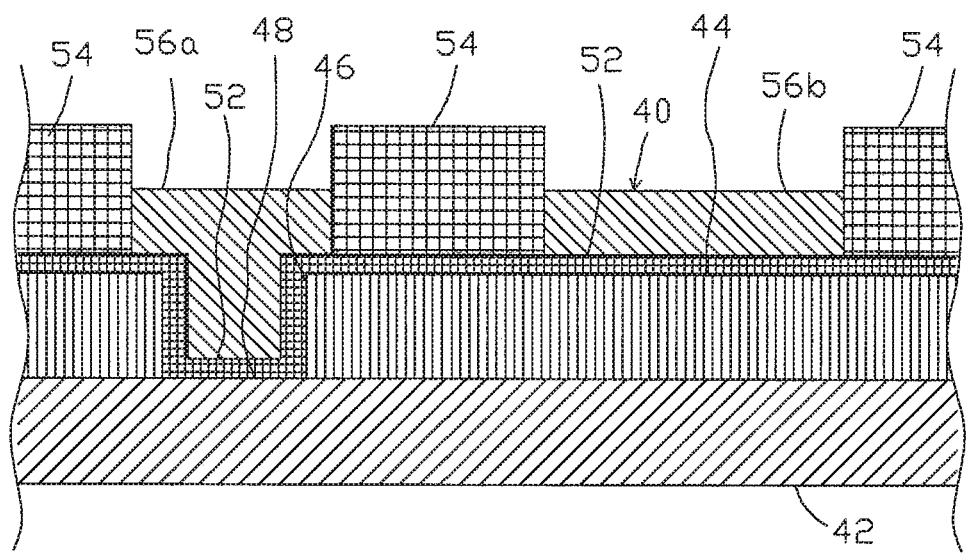
FIG. 6 is a cross-sectional view of the portion of the flexible circuit shown in FIG. 5 after electroplating a conductive metal onto portions of the seed layer to form conductive traces, according to some embodiments.

FIG. 6 is a cross-sectional view of the portion of the flexible circuit 40 showing additional processing after the processing described above in FIG. 5, in some embodiments. FIG. 6 shows the formation of a plurality of conductive traces 56a, 56b on the seed layer 52. The plurality of conductive traces 56a, 56b can be formed by electroplating a conductive metal, such as copper, onto portions of the seed layer 52 not covered by the patterned photoresist layer 54. The patterned photoresist layer 54 blocks deposition of the conductive metal onto the seed layer 52. While just two conductive traces, 56a and 56b, are shown for ease of illustration, it is understood that embodiments may include more than two conductive traces.

Figure 7:
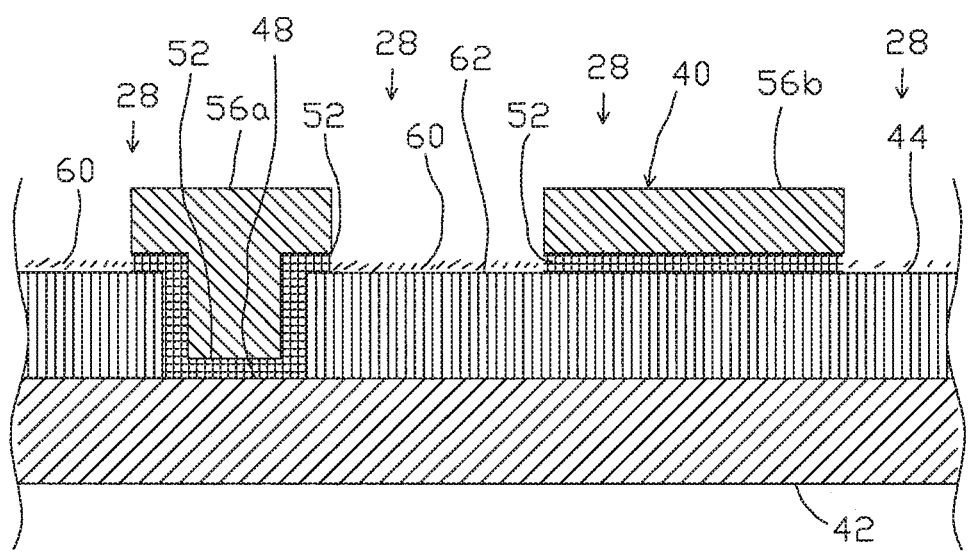
FIG. 7 is a cross-sectional view of the portion of the flexible circuit shown in FIG. 6 after removal of the patterned photoresist layer a portion of the seed layer, according to some embodiments.

FIG. 7 is a cross-sectional view of the portion of the flexible circuit 40 showing additional processing after the processing described above in FIG. 6, in some embodiments. FIG. 7 shows the flexible circuit 40 after removal of the patterned photoresist layer 54 and the removal of a portion of the seed layer 52. The patterned photoresist layer 54 can be removed by any of a number of chemical photoresist strippers known in the art. After the patterned photoresist layer 54 is removed exposing a portion of the seed layer 52, the exposed portion of the seed layer 52 is etched away by chemical etchants known in the art to expose a portion of the dielectric polymer layer 44.

In some embodiments, after etching away the seed layer 52, conductive contaminants 60 may remain on an exposed portion 62 of the surface of the dielectric polymer layer 44. The conductive contaminants 60 may include, for example, residues of the seed layer 52 not completely removed by the chemical etching. It has been found that even if the residues are not sufficient to directly decrease the resistance between adjacent conductive traces, such as the conductive traces 56a and 56b, during subsequent processing, such as electroless plating of another conductive metal 64 (FIG. 6), the residues may act as nucleation sites for the growth of conductive structures, or stringers, between the conductive traces 56a and 56b. Such conductive stringers can significantly decrease the resistance between the conductive traces 56a and 56b, adversely affecting the performance of the flexible circuit 40. Thus, in some embodiments, after the seed layer 52 is etched away, the exposed portion 62 of the surface of the dielectric polymer layer 44 is treated with the atmospheric plasma 28 described above in reference to FIG. 1, in which the gas includes oxygen. Not wishing to be bound by any theory, it is believed that the residues are oxidized by the atmospheric plasma 28 and that once oxidized, the residues are no longer suitable as a nucleation site for the growth of conductive stringers.

In some embodiments, the treatment with the atmospheric plasma 28 to remove the conductive contaminants 60 can be done at a power of about 3,000 watts and a gas flow rate of about 15 liters per minute consisting essentially of oxygen, with a dwell time of the flexible circuit 40 in the atmospheric plasma 28 of about 27 seconds. The increased energy and exposure time, compared with some other atmospheric plasma process describe herein, may be necessary to sufficiently oxide the conductive contamination 60.

In some embodiments, the gas may include more than 50%, more than 60%, more than 70%, more than 90%, or more than 99% oxygen, or more than any percentage of any of the preceding percentages. All gas percentages are a percentage of the total gas flow provided by the flow 22 (FIG. 1). In some embodiments, the gas consists essentially of oxygen. It has been found that the atmospheric plasma 28 with the gas consistently essentially of oxygen is more effective at preventing subsequent growth of conductive stringers than gas including a mix of 50% oxygen and 50% argon.

Figure 8:
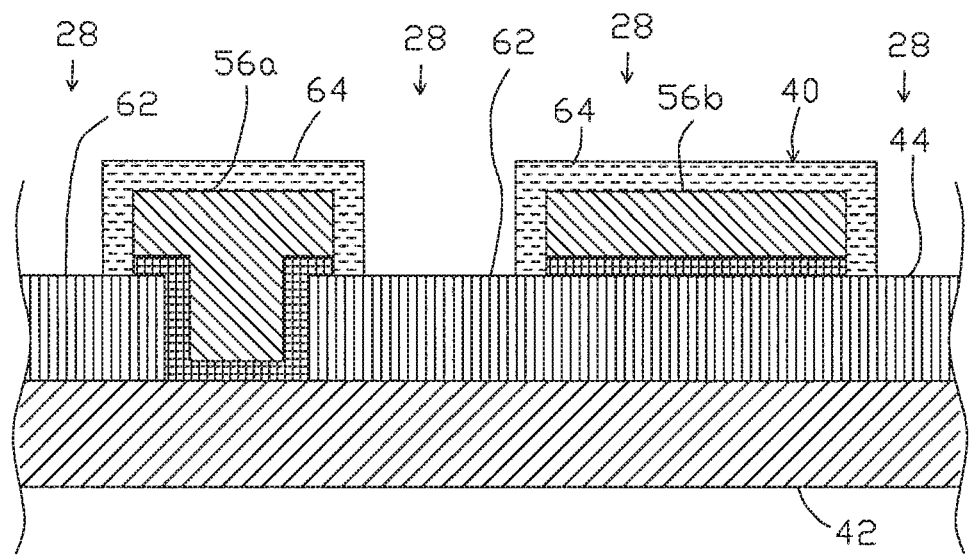
FIG. 8 is a cross-sectional view of the portion of the flexible circuit shown in FIG. 7 after electroless deposition of another conductive metal onto the conductive traces, according to some embodiments.

FIG. 8 is a cross-sectional view of the portion of the flexible circuit 40 showing additional processing after the processing described above in FIG. 7, in some embodiments. FIG. 8 shows the flexible circuit 40 after electroless deposition of another conductive metal 64 onto the conductive traces 56a, 56b. After deposition of the conductive metal 64, the exposed portion 62 of the surface of the dielectric polymer layer 44 can be treated with the atmospheric plasma 28 described above in reference to FIG. 1, in which the gas includes oxygen. In some embodiments, the gas consists essentially of oxygen. The treatment functionalizes the exposed portion 62 as the ionized oxygen atoms break carbon chains of the dielectric polymer layer 44, creating carbon radicals at the end of the broken chains. The ionized oxygen atoms combine with the carbon radicals, thus incorporating extra oxygen atoms into the exposed portion 62. These extra oxygen atoms are available as bonding sites for polymer chains subsequently deposited on the exposed portion 62 of the surface of the dielectric polymer layer 44.

In some embodiments, the treatment with the atmospheric plasma 28 to functionalize the exposed portion 62 of the surface of the dielectric polymer layer 44 can be done at a power of about 2,000 watts and an oxygen gas flow rate of about 15 liters per minute, with a dwell time of the flexible circuit 40 in the atmospheric plasma 28 of about 5 seconds. Limiting the energy and exposure time may functionalize the surface without damaging the dielectric polymer layer 44.

Figure 9:
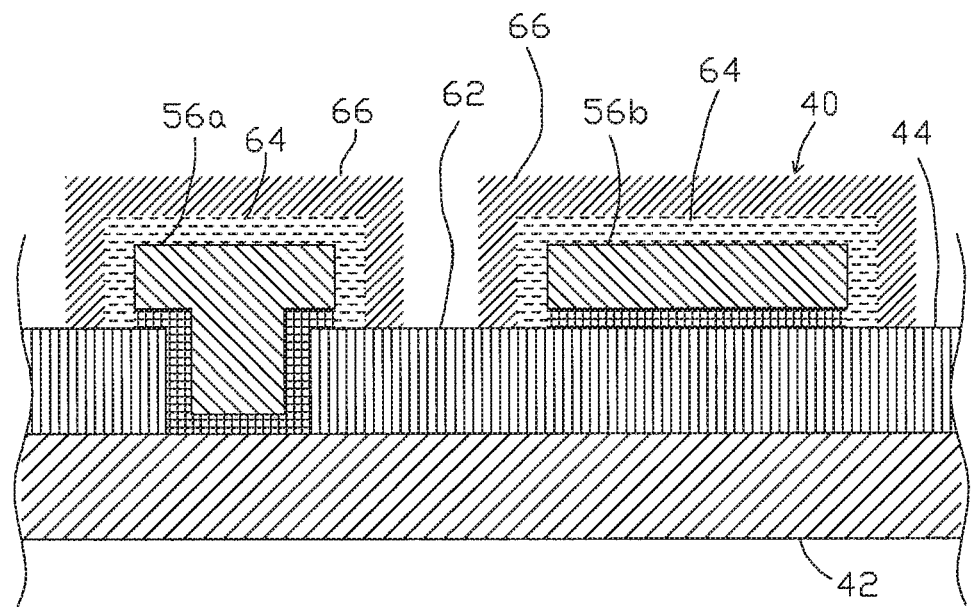
FIG. 9 is a cross-sectional view of the portion of the flexible circuit shown in FIG. 8 after forming a cover coat on the conductive traces, according to some embodiments.

FIG. 9 is a cross-sectional view of the portion of the flexible circuit 40 showing additional processing after the processing described above in FIG. 8, in some embodiments. After functionalizing the exposed portion 62 of the surface of the dielectric polymer layer 44, a dielectric polymer coating 66 can be formed on the conductive traces 56a, 56b and at least the part of the exposed portion 62 that is adjacent to the conductive traces 56a, 56b to form a cover coat. The dielectric polymer coating 66 can be made of any suitable, curable polymer, such as a polyimide. In some embodiments, the dielectric polymer coating 66 may be formed by deposition of a photoimageable polyimide precursor onto the conductive traces 56a, 56b and the exposed portion 62, followed by photolithographic processes well known in the art, including exposing the polyimide precursor through a photomask and developing to define the dielectric polymer coating 66. Once the dielectric polymer coating 66 is formed, the polyimide precursor is cured to form the polyimide and heat bond the dielectric polymer coating 66 to the dielectric polymer layer 44.

The stronger the bond between the dielectric polymer coating 66 and the dielectric polymer layer 44, the more durable and effective the cover coat will be in protecting the conductive traces 56a, 56b. Forming the dielectric polymer coating 66 on the functionalized exposed portion 62 of the surface of the dielectric polymer layer 44 forms stronger bonds as the extra oxygen atoms of the functionalized surface bond with polymer chains of the dielectric polymer coating 66.

Although the embodiments shown in FIGS. 8 and 9 show the functionalization of the exposed portion 62 and the application of the dielectric polymer coating 66 following the electroless deposition of the conductive metal 64, in other embodiments, the conductive metal 64 may be omitted. In such embodiments the dielectric polymer coating 66 if formed directly on the conductive traces 56a, 56b after treatment with the atmospheric plasma 28 to functionalize the exposed portion 62 of the surface of the dielectric polymer layer 44.

Figure 10:
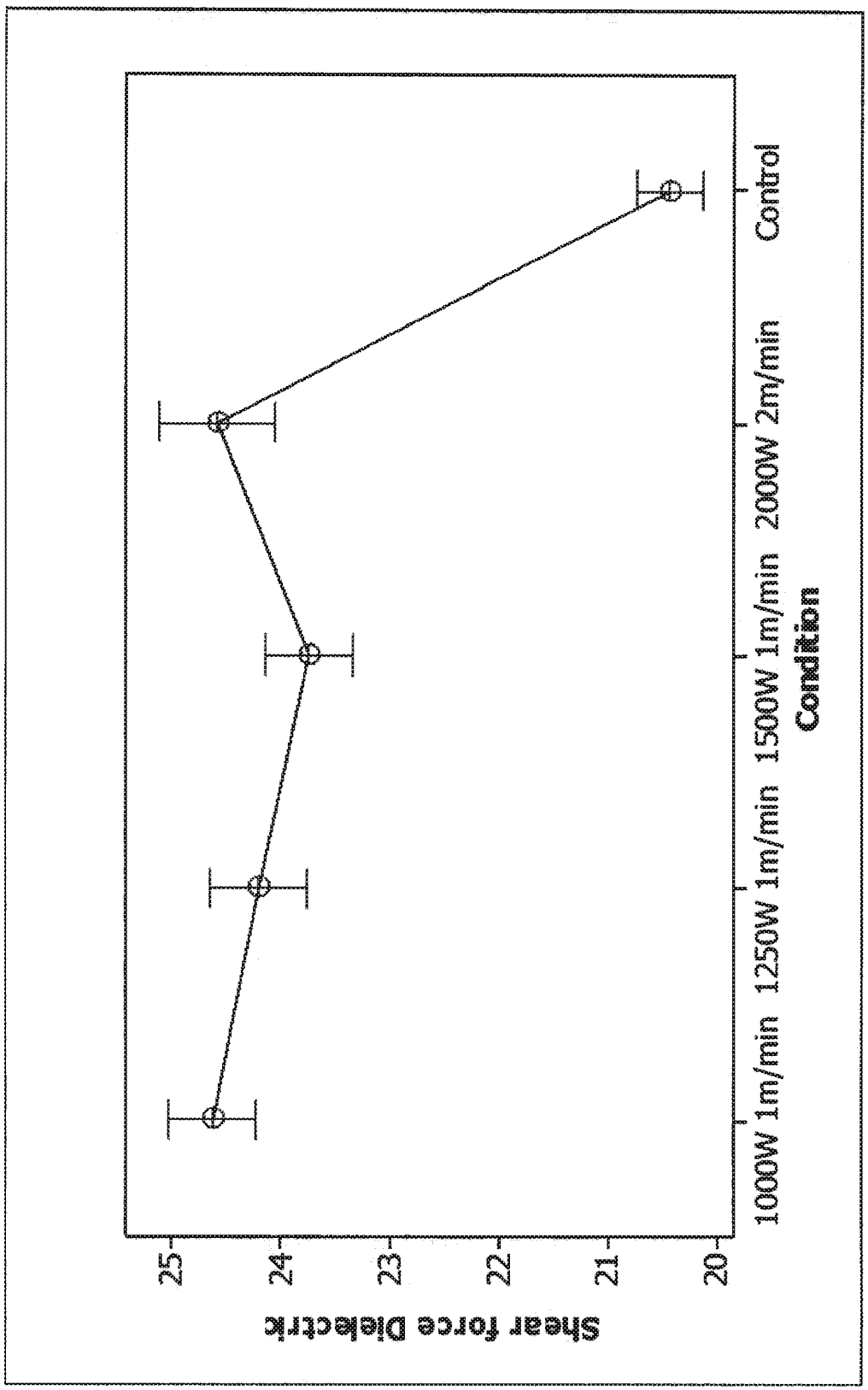
FIG. 10 is a graph showing the maximum shear force between a dielectric polymer layer and the dielectric polymer coating for samples treated with an atmospheric plasma, according to some embodiments.

FIG. 10 is a graph showing the maximum shear force between the dielectric polymer layer 44 and the dielectric polymer coating 66 samples treated with the atmospheric plasma 28 using a variety of powers and dwell times to functionalized the exposed portion 62 of the surface of the dielectric polymer layer 44 prior to forming the dielectric polymer coating 66. As shown in FIG. 10, the samples treated with the atmospheric plasma 28 show greater shear forces compared to samples receiving a treatment by nitrogen ion beam (Control).

Figure 11:
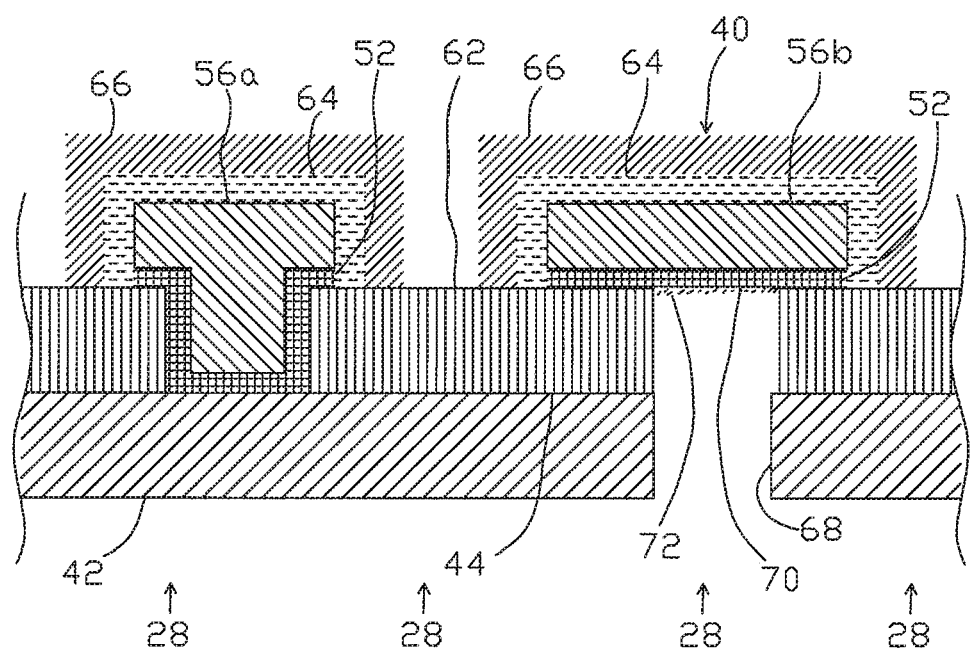
FIG. 11 is a cross-sectional view of the portion of the flexible circuit shown in FIG. 9 after formation of an opening in the metal substrate on a side opposite the dielectric polymer layer and etching the dielectric polymer layer through the opening in the metal substrate, according to some embodiments.

FIG. 11 is a cross-sectional view of the portion of the flexible circuit 40 showing additional processing after the processing described above in FIG. 9, in some embodiments. FIG. 11 shows the formation of an access hole through the metal substrate 42 and the dielectric layer 44. An opening 68 through the metal substrate 42 may be formed on a side opposite the dielectric polymer layer 44 (backside). The opening 68 may be formed by, for example, patterning a photoresist on the backside of the flexible circuit 40 and then etching the metal substrate 42 with an etchant suitable for material of the metal substrate 42. For example, if the metal substrate 42 is made of stainless steel, then a suitable etchant would dissolve stainless steel without aggressively attacking the photoresist. Such etchants are known in the art. After the opening 68 through the metal substrate 42 is formed, the dielectric polymer layer 44 can be etched, using the metal substrate 42 as a mask, to extend the opening 68 to expose a portion 70 of the seed layer 52 underlying the conductive trace 56b.

As shown in FIG. 11, the opening 68 can include a contamination 72 on the exposed portion 70 of the seed layer 52. The contamination 72 may include, for example, residue from the removal of the dielectric polymer layer 44. It has been found that, if not removed, the contamination 72 may increase the resistance of a backside electrical connection to the conductive trace 56b. Thus, after the opening 68 formed, the exposed portion 70 of the seed layer 52 is treated with the atmospheric plasma 28 described above in reference to FIG. 1 to remove the contamination 72.

In some embodiments, the treatment with the atmospheric plasma 28 to remove the contamination 72 can be done at a power of about 3,000 watts and a gas flow rate of about 15 liters per minute consisting essentially of oxygen, with a dwell time of the flexible circuit 40 in the atmospheric plasma 28 of about 38 seconds.

Figure 12A:
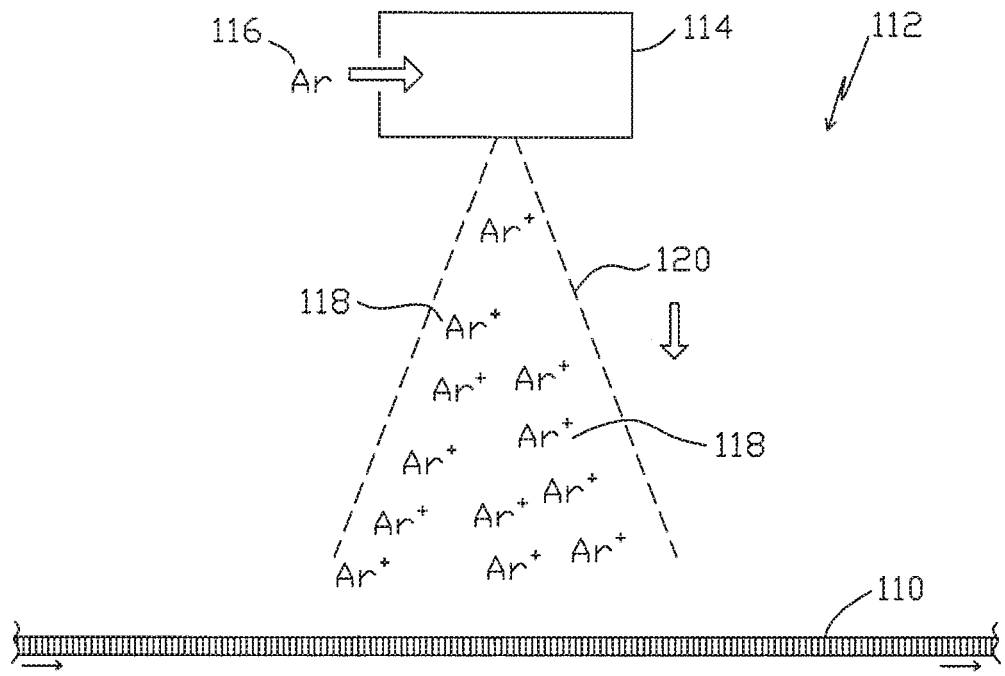
FIGS. 12A and 12B show schematic cross-sectional views of a web containing flexible circuits treated by an ion beam, according to some embodiments.
Figure 12B:
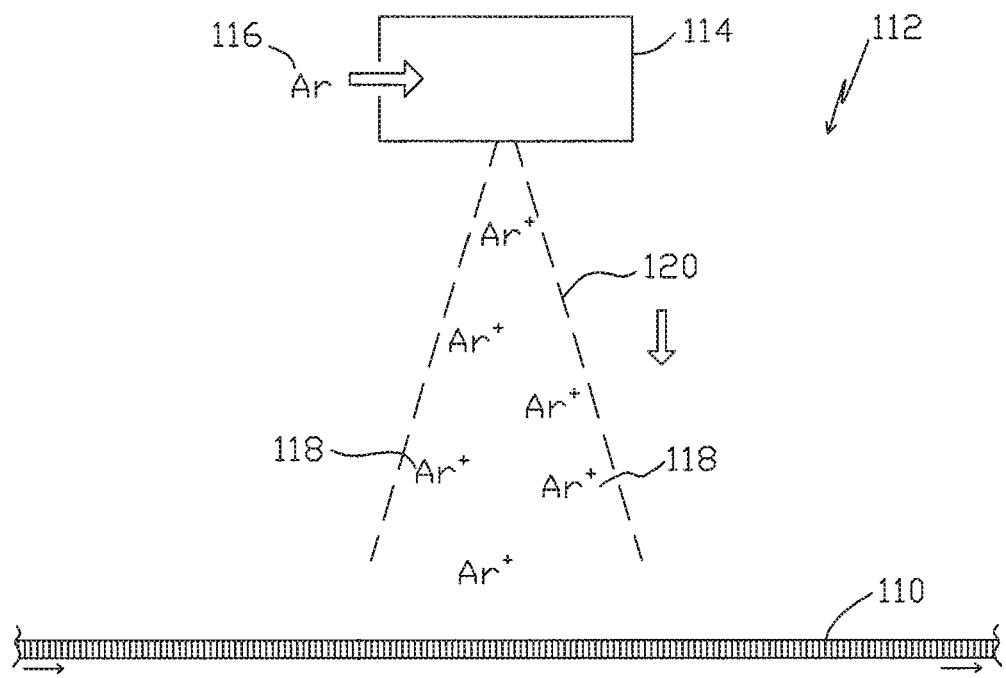
Figure 13:
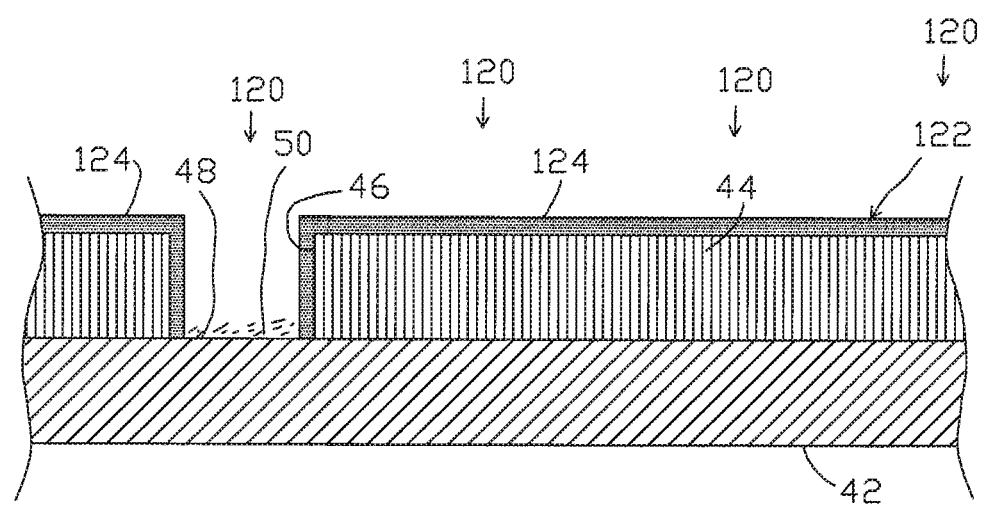
FIG. 13 is a cross-sectional view of a portion a flexible circuit showing at least one opening in a dielectric polymer layer and formation of a surface modified layer, according to some embodiments.

FIGS. 12A and 12B show schematic cross-sectional views of a web containing flexible circuits treated by an ion beam, according to some embodiments. FIGS. 12A and 12B show a web 110 moving through a vacuum system 112. The web 110 includes a plurality of flexible circuits, such as flexible circuit flexible circuit 122 (FIG. 13). The web 110 can move through the vacuum system 112 at any speed necessary to producing a dwell time within the vacuum system 112 suitable for a particular ion beam treatment. The vacuum system 112 includes an ion source 114. The ion source 114 ionizes a gas 116 to produce a plasma including positively charged ions 118, and then accelerates the ions 118 away from the ion source 114 to form an ion beam 120. The ion source 114 can be any type of ion source known in the art, including those employing a powered grid to accelerate the positively charged ions 118 by attraction, as well as those employing a powered anode to accelerate the positively charged ions 118 by repulsion.

In operation, while the web 110 moves through the vacuum system 112, the ion source 114 accelerates the ion beam 120 toward the web 110 to clean and/or treat the flexible circuits moving past on the web 110. The mean ion energy may range from about 500 eV to about 1,500 eV, significantly higher than the ion energies associate with the atmospheric plasma 28 discussed above. Such high-energy ions are able to produce beneficial treatments in the production of flexible circuits, as described below. The energy of the ions 118 in the ion beam 120 may be controlled to deliver a desired treatment to the web 110. For example, as shown in FIG. 12A, a diffused ion beam 120 may be formed by, for example, increasing a gas flow through the ion source 114 to produce a greater density of ions 118. The greater density of ions 118 can lead to increased collisions between the ions 118, resulting in lower ion energies and a wider, diffused beam. The diffused ion beam 120 may have ion bombardment energies ranging from about 500 eV to less than about 1,000 eV. For treatments requiring a higher-energy ion beam, a collimated ion beam 120 may be formed, as shown in FIG. 12B. The collimated ion beam 120 may be formed by, for example, decreasing a gas flow through the ion source 114 to produce a lower density of ions 118. The lower density of ions 118 can lead to decreased collisions between the ions 118, resulting in higher ion energies and a narrow, collimated beam. The collimated ion beam 120 may have ion bombardment energies ranging from about 1,000 eV to as high as about 1,500 eV.

Pressure can be maintained in the vacuum system 112 during the cleaning and/or treatment by the ion beam 120. In some embodiments, the pressure can be less than 200 mTorr. In some embodiments, the pressure can be less than about 50 mTorr.

Although the embodiment of FIGS. 12A and 12B shows the ions 118 consistently essentially of positively charged argon ions, it is understood that other embodiments may employ ions of other gases, including mixtures of any of the noble gases with oxygen, nitrogen, hydrogen, or any of the halogens in any suitable combinations and ratios.

FIG. 13 is a cross-sectional view of a portion a flexible circuit showing at least one opening in a dielectric polymer layer, according to some embodiments. FIG. 13 shows a flexible circuit 122 including metal substrate 42, dielectric polymer layer 44, and opening 46. The metal substrate 42, the dielectric polymer layer 44, and the opening 46 can be as described above for the embodiment of FIG. 2. The dielectric polymer layer 44 is disposed on a surface 48 of the metal substrate 42. As shown in FIG. 13, the opening 46 can include a contamination 50 on the exposed portion of the surface 48, as described above in reference to FIG. 2. As noted above, if not removed, the contamination 50 may increase the resistance of an electrical connection between a conductive trace formed on the dielectric polymer layer 44 and metal substrate 42. Thus, after the opening 46 is formed, the exposed portion of the surface 48 of the metal substrate 42 can be treated with the ion beam 120 described above in reference to FIGS. 12A and 12B to remove the contamination 50. In some embodiments, after the opening 46 is formed, the exposed portion of the surface 48 of the metal substrate 42 can be treated with the atmospheric plasma 28 described above in reference to FIG. 2, and then treated with the ion beam 120 described above in reference to FIGS. 12A and 12B to remove the contamination 50.

In some embodiments, the metal substrate 42 is made of a material, such as stainless steel, that forms a native oxide. It has been found that treating the exposed portion of the surface 48 with the ion beam 120 removes and/or disrupts the native oxide. Depositing a conductive layer, such as the seed layer 52 described above in reference to FIG. 4, onto the exposed surface 42 after the ion beam treatment and before exposing the surface 42 to oxygen, further significantly improves contact resistance, as explained below in reference to FIG. 14. This may be done, for example, by incorporating including both the ion source 114 and a metal sputter deposition capability in the vacuum system 112.

In some embodiments, the treatment with the ion beam 120 to remove the contamination 50 and the native oxides can be done at ion energies ranging from about 500 eV to about 1,500 eV. These relatively high mean ion energies are sufficient to disrupt the metal-oxide bonds in an efficient manner. In some embodiments, the ion beam 120 can consist essentially of argon ions. In other embodiments, the ion beam 120 can consist essentially of nitrogen ions. In still other embodiments, the ion beam 120 can consist essentially of a mixture of argon and nitrogen ions.

Figure 14:
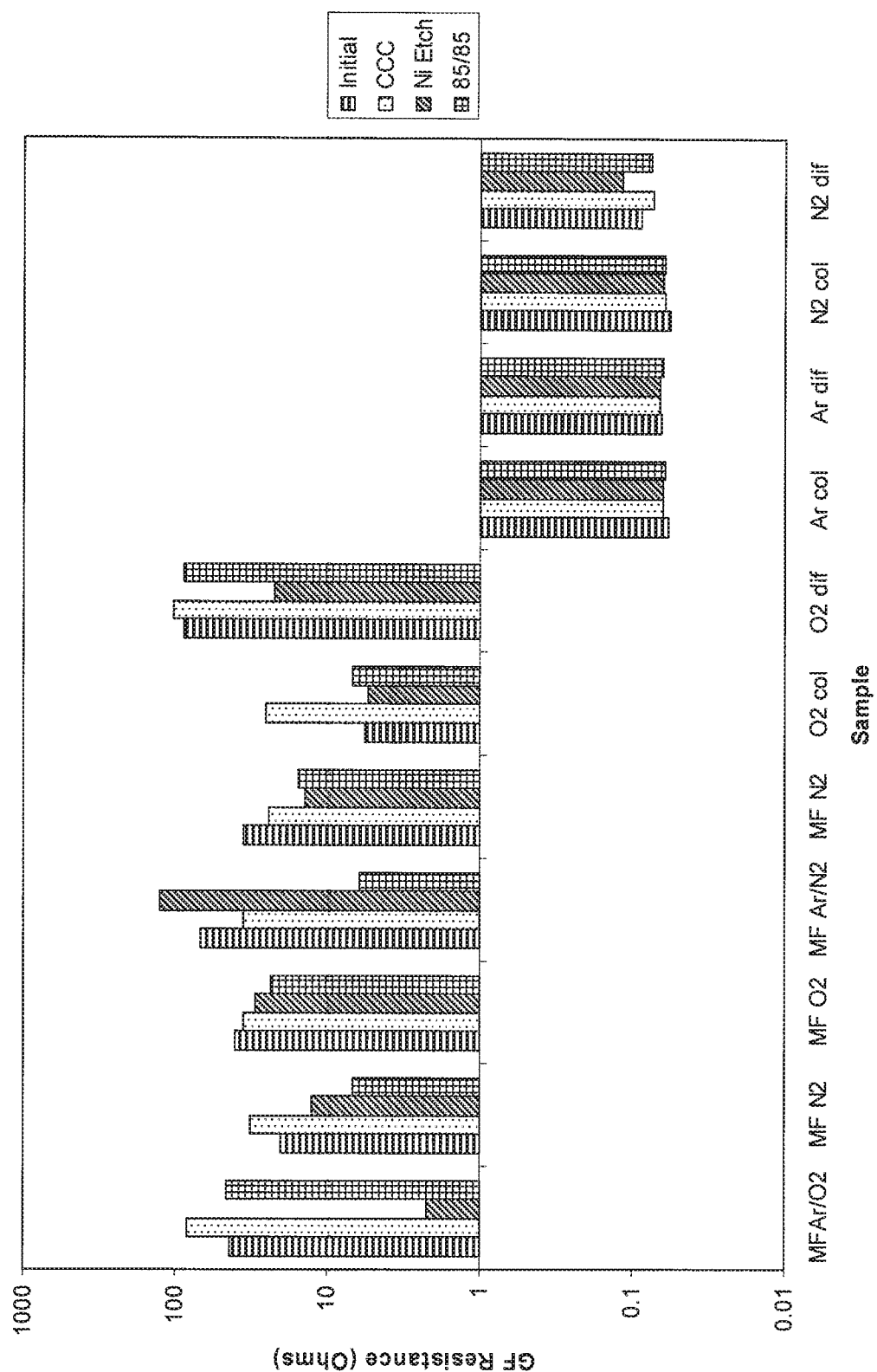
FIG. 14 is a chart showing ground feature electrical resistance of flexures receiving various plasma and ion beam treatments, according to embodiments.

FIG. 14 is a chart showing ground feature electrical resistance of flexures receiving various plasma and ion beam treatments, according to embodiments. FIG. 14 shows electrical resistance for samples at various points in the process, including after formation of conductive traces (Initial), after curing a dielectric polymer coating (CCC) and after extended exposure of the completed flexure to an environment of 85% humidity at 85° C. (85/85). Flexures were treated with plasmas (designated "MF") or with ion beams either diffused (designated "dif") or collimated (designated "col"), and using argon, nitrogen, or oxygen gas to generate corresponding ions. As shown in FIG. 14, flexures treated with ion beams consisting essentially of argon ions or consisting essentially of nitrogen ions had significantly lower ground feature resistances than those treated with plasmas or with ion beams having oxygen ions. Without wishing to be bound by any theory, it is believed that low mean ion energies in the plasmas (less than 100 eV) are not sufficient to remove and/or disrupt the native oxide, while the mean ion energies in both the diffused ion beams (500 eV to 1,000 eV) and the collimated ion beams (1,000 eV to 1,500) are more than sufficient. The ion beams containing oxygen ions are likely have sufficient mean ion energies, the oxygen ions appear to reform the oxide, resulting in higher resistance ground feature resistance.

Referring back to FIG. 13, in some embodiments, the treatment with the ion beam 120 can modify the surface of the dielectric polymer layer 44 to form a surface modified layer 124. The surface modified layer 124 can improve the peel strength of conductive traces, as explained below in reference to FIG. 15. The surface modified layer 124 can be a low-oxygen, graphite-like layer formed from the action of the ion beam 120 on the material of the dielectric polymer layer 44, for example, polyimide. The surface modified layer 124 can be formed at relatively high mean ion energies. In some embodiments, the treatment with the ion beam 120 to form the surface modified layer 124 can be done at ion energies ranging from about 1,000 eV to about 1,500 eV. In some embodiments, the ion beam 120 can consist essentially of argon ions. In other embodiments, the ion beam 120 can consist essentially of nitrogen ions. In still other embodiments, the ion beam 120 can consist essentially of a mixture of argon and nitrogen ions.

Figure 15:
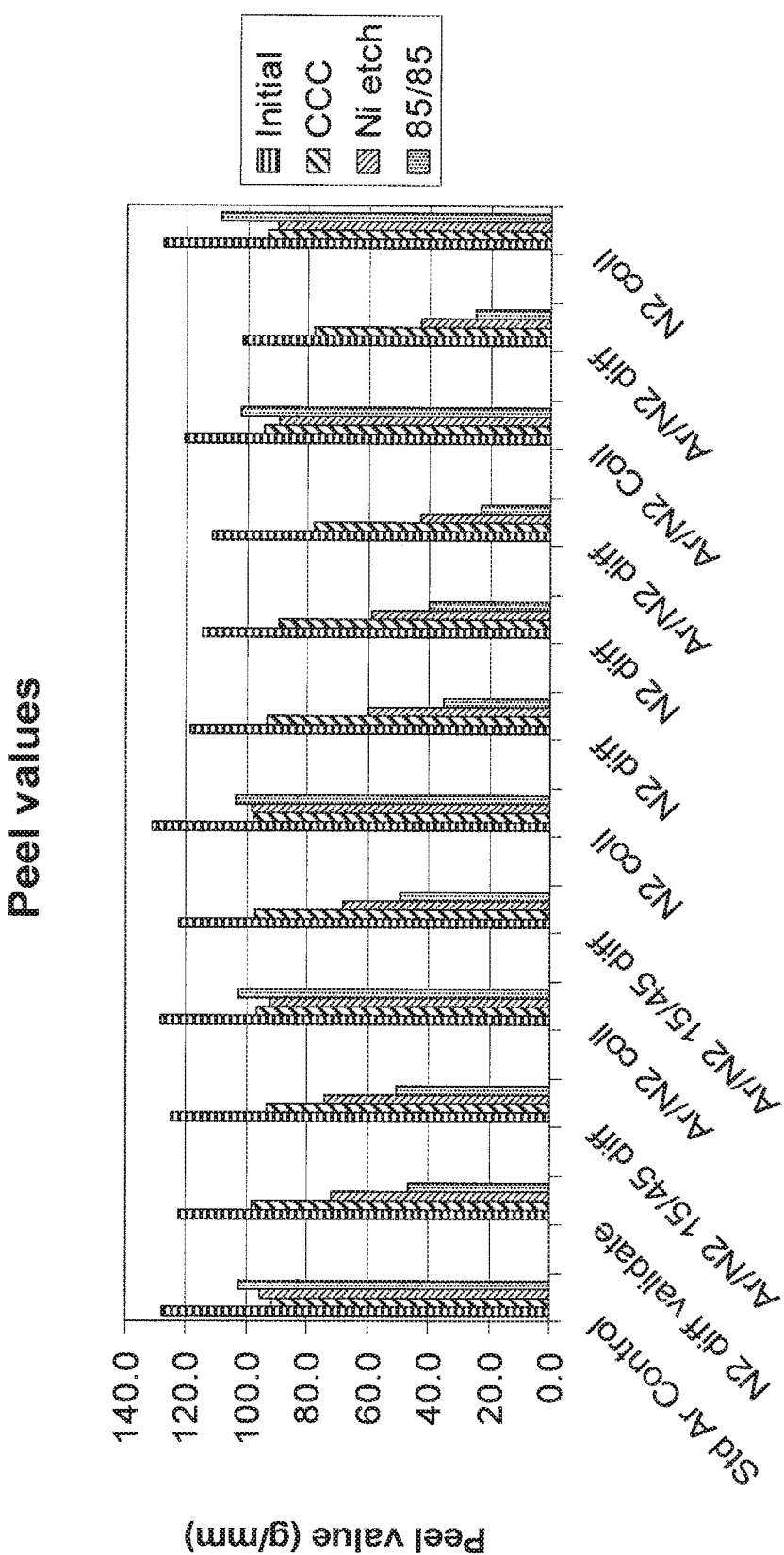
FIG. 15 is a chart showing peel strength for various ion beam treatments, according to embodiments.

FIG. 15 is a chart showing peel strength for various ion beam treatments, according to embodiments. FIG. 15 shows peel strength of conductive traces of flexures, such as conductive traces 56a, 56b, for samples at various points in the process, including after formation of conductive traces (Initial), after curing a dielectric polymer coating (CCC) and after extended exposure of the completed flexure to an environment of 85% humidity at 85° C. (85/85). Flexures were treated with ion beams either diffused (designated "dif") or collimated (designated "col"), and with argon ions, nitrogen ions, or mixtures of argon and nitrogen ions. As shown in FIG. 15, treatment with the collimated ion beams produced flexures having peel strengths greater than 80 g/mm after extended exposure of the completed flexure to an environment of 85% humidity at 85° C. (85/85), with values exceeding 100 g/mm. In contrast the, treatment with the diffused ion beams produced flexures having peel strengths less than 80 g/mm after extended exposure of the completed flexure to an environment of 85% humidity at 85° C. (85/85), with values not exceeding 60 g/mm. Without wishing to be bound by any theory, it is believed that the higher mean ion energies of 1,000 eV to 1,500 eV produced in the collimated beams are necessary to produce the graphite-like, surface modified layer 124.

Figure 16:
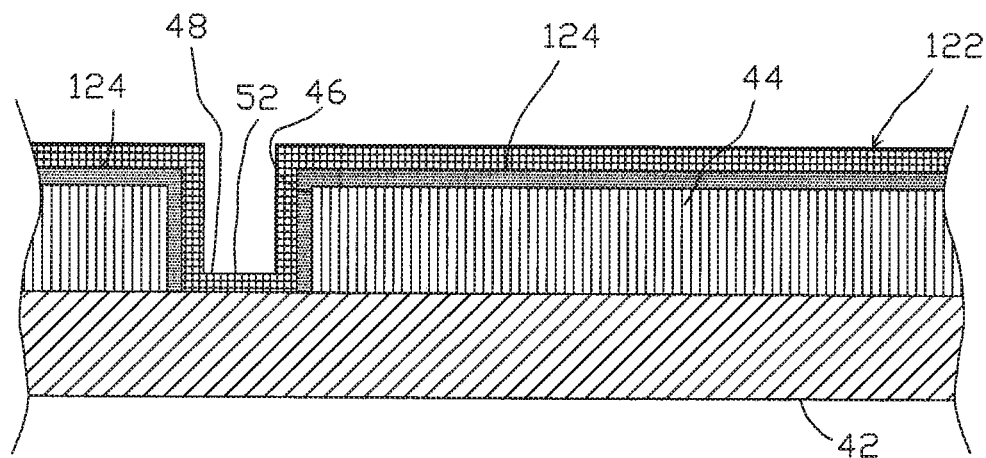
FIG. 16 is a cross-sectional view of the portion of the flexible circuit shown in FIG. 13 after deposition of a seed layer, according to some embodiments

FIG. 16 is a cross-sectional view of the portion of the flexible circuit 122 showing additional processing after the processing described above in reference to FIG. 13, in some embodiments. FIG. 16 shows a seed layer 52 deposited onto the surface modified layer 124 and the exposed portion of the surface 48 of the metal substrate 42 after the treatment with the ion beam 120 to clean and/or modify the surface. With the contamination 50 and the native oxide removed, the seed layer 52 is able to form a low resistance electrical connection with the metal substrate 42. The seed layer 52 may be formed, for example, by sputter deposition of a chromium layer onto the surface modified layer 124 and the exposed portion of the surface 48 of the metal substrate 42, followed by sputter deposition of a copper layer onto the chromium layer.

Figure 17:
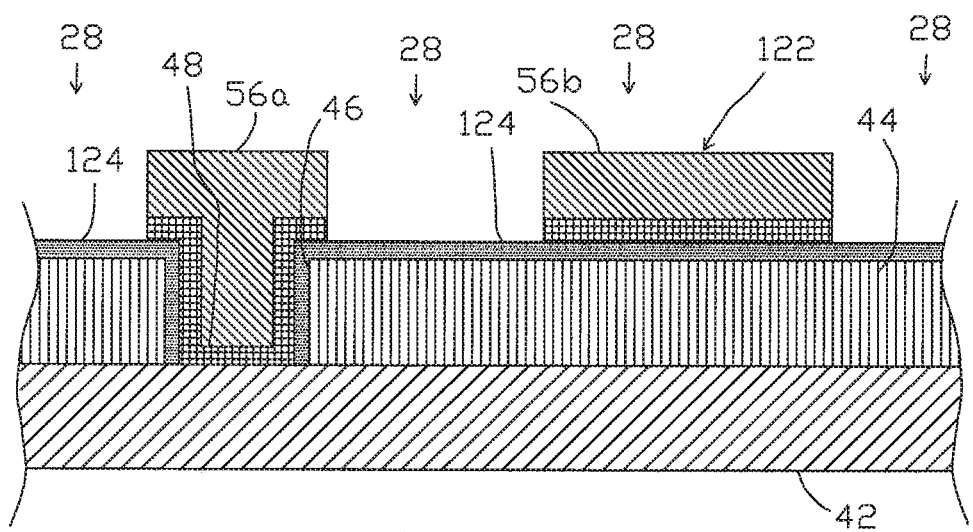
FIG. 17 is a cross-sectional view of the portion of the flexible circuit shown in FIG. 16 after the formation of conductive traces and removal of an exposed portion of the seed layer, according to some embodiments.

FIG. 17 is a cross-sectional view of the portion of the flexible circuit 122 showing additional processing after the processing described above in reference to FIG. 16, in some embodiments. FIG. 17 shows the flexible circuit 122 following the formation of conductive traces 56a, 56b and removal of the exposed portion of the seed layer 52 as described above in reference to FIGS. 5-7. As noted above, it is believed that the surface modified layer 124 acts a tie layer between the dielectric polymer layer 44 and the seed layer 52 to improve the adhesion between the seed layer 52 and the dielectric polymer layer 44, resulting in greater peel strength of the conductive traces 56a, 56b (FIG. 15).

As shown in FIG. 17, etching away the seed layer 52 exposes a portion of the surface modified layer 124. As noted above, the surface modified layer 124 is a graphite-like layer and is somewhat conductive. The conductive surface modified layer 124 can significantly decrease the resistance between the conductive traces 56a and 56b, adversely affecting the performance of the flexible circuit 122. Thus, in some embodiments, after the seed layer 52 is etched away, the exposed portion of the surface modified layer 124 can be treated with the atmospheric plasma 28 described above in reference to FIG. 1, in which the gas includes oxygen. Not wishing to be bound by any theory, it is believed that the atmospheric plasma 28 can remove at least some of the surface modified layer 124 and/or can oxidize the rest of the surface modified layer 124, rendering the surface modified layer 124 no longer conductive.

In some embodiments, the gas for the atmospheric plasma 28 may include more than 50%, more than 60%, more than 70%, more than 90%, or more than 99% oxygen, or more than any percentage of any of the preceding percentages. All gas percentages are a percentage of the total gas flow provided by the flow 22 (FIG. 1). In some embodiments, the gas consists essentially of oxygen.

In some embodiments, the treatment with the atmospheric plasma 28 to remove and/or oxidize the surface modified layer 124 can be done at a power of about 3,000 watts and a gas flow rate of about 15 liters per minute consisting essentially of oxygen, with a dwell time of the flexible circuit 122 in the atmospheric plasma 28 of about 27 seconds. The increased energy and exposure time, compared with some other atmospheric plasma process describe herein, may be necessary to sufficiently remove and/or oxidize the surface modified layer 124.

Figure 18:
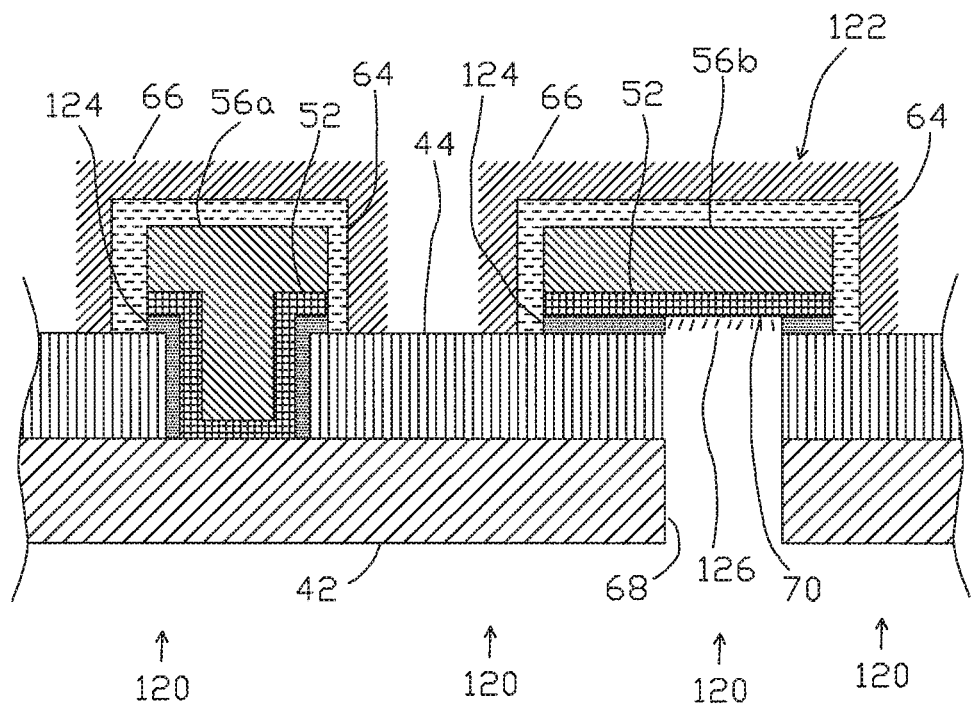
FIG. 18 is a cross-sectional view of the portion of the flexible circuit shown in FIG. 17 after formation of an opening in the metal substrate on a side opposite the dielectric polymer layer and etching the dielectric polymer layer through the opening in the metal substrate, according to some embodiments.

FIG. 18 is a cross-sectional view of the portion of the flexible circuit 122 showing additional processing after the processing described above in reference to FIG. 17, in some embodiments. FIG. 18 shows the flexible circuit 122 following the removal and/or oxidation of the surface modified layer 124 from between the conductive traces 56a and 56b. FIG. 18 also shows the flexible circuit 122 following electroless deposition of another conductive metal 64 onto the conductive traces 56a, 56b, functionalization of the surface of the dielectric polymer layer 44, and formation of the dielectric polymer coating 66 as described above in reference to FIGS. 8 and 9. FIG. 18 also shows the formation of an access hole, opening 68, through the metal substrate 42 and the dielectric layer 44, as described above in reference to FIG. 11. As shown in FIG. 18, the opening 68 can include a contamination 126 on the exposed portion 70 of the seed layer 52. The contamination 126 may include, for example, residue from the removal of the dielectric polymer layer 44 and the surface modified layer 124. It has been found that, if not removed, the contamination 126 may increase the resistance of a backside electrical connection to the conductive trace 56b. Thus, after the opening 68 formed, the exposed portion 70 of the seed layer 52 can be treated with the atmospheric plasma 28 described above in reference to FIG. 1 to remove the contamination 126. Alternatively, after the opening 68 formed, the exposed portion 70 of the seed layer 52 can be treated with the ion beam 120 described above in reference to FIGS. 12A and 12B to remove the contamination 126.

In some embodiments, the treatment with the atmospheric plasma 28 to remove the contamination 126 can be done at a power of about 3,000 watts and a gas flow rate of about 15 liters per minute consisting essentially of oxygen, with a dwell time of the flexible circuit 40 in the atmospheric plasma 28 of about 38 seconds.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

The invention claimed is:

1. A method of producing a flexible circuit, the method comprising:
   directing a gas that is perpendicular to a surface of the flexible circuit, the gas penetrating a first electrode located above the flexible circuit, the flexible circuit being part of a web that includes a plurality of circuits including the flexible circuit, wherein the flexible circuit includes a flexible metal substrate and a dielectric polymer layer disposed on the metal substrate;
   depositing a seed layer on the dielectric polymer layer, wherein an opening is formed on the dielectric polymer layer to expose a portion of the flexible metal substrate;
   covering a portion of the seed layer with a patterned photoresist layer;
   electroplating a conductive metal onto portions of the seed layer not covered by the patterned photo-resist layer to form a plurality of conductive traces, wherein a first conductive trace of the plurality of conductive traces are formed in the opening of the dielectric polymer layer that establishes an electrical connection between the at least one conductive trace and the flexible metal substrate and a second conductive trace of the plurality of conductive traces is at least partially disposed over the dielectric polymer layer;

plating another conductive metal onto the plurality of conductive traces by electroless plating;

stripping away the patterned photoresist layer to expose the portion of the seed layer; etching away the exposed portion of the seed layer to expose a portion of a surface of the dielectric polymer layer;

forming a dielectric polymer coating over each of the plurality of conductive traces and at least part of the dielectric polymer layer such that a part of the dielectric polymer layer is exposed between conductive traces of the plurality of conductive traces;

applying an alternative voltage to the first electrode to generate a voltage differential between the first electrode and a second electrode connected to a ground, wherein the voltage differential creates an atmospheric plasma from the gas, the second electrode located below the flexible circuit; and treating the surface of the flexible circuit and the exposed portion of the surface of the dielectric polymer layer with the atmospheric plasma, the second electrode including a roller that is in contact with the web and supports and propels the web including at least the flexible circuit through the atmospheric plasma in a direction that is perpendicular to the gas, wherein the atmospheric plasma removes conductive contaminants from the exposed portion of the surface of the dielectric polymer layer between adjacent conductive traces.

2. The method of claim 1, wherein the flexible circuit includes a flexible metal substrate and the dielectric polymer layer disposed on the metal substrate, the method further comprising:

forming at least one opening in the dielectric polymer layer to expose a portion of a surface of the metal substrate;

treating the exposed portion of the surface of the metal substrate with the atmospheric plasma to remove contaminants from the exposed portion of the metal substrate;

depositing the seed layer on the dielectric polymer layer and the treated surface of the metal substrate; and forming the plurality of conductive traces on the seed layer, wherein at least one of the conductive traces extends to the treated surface of the metal substrate to form an electrical contact between the conductive trace and the metal substrate.

3. The method of claim 1, wherein the flexible circuit includes the flexible metal substrate, the dielectric polymer layer disposed on the flexible metal substrate, and the plurality of conductive traces disposed on the dielectric polymer layer, the method further comprising:

treating a surface of the dielectric polymer layer with the atmospheric plasma, wherein the atmospheric plasma functionalizes the surface of the dielectric polymer layer; and forming the dielectric polymer coating covering the plurality of conductive traces and a portion of the functionalized surface of the dielectric polymer layer adjacent to each of the plurality of conductive traces.

4. The method of claim 1, wherein the flexible circuit includes the flexible metal substrate, the dielectric polymer layer disposed on the metal substrate, the seed layer, and the plurality of conductive traces disposed on the seed layer, the method further comprising:

forming at least one opening through the flexible metal substrate on a side opposite the dielectric polymer layer;

etching the dielectric polymer layer through the at least one opening to expose a portion of a surface of the seed layer of one of the plurality of conductive traces; and treating the exposed portion of the surface of the seed layer with the atmospheric plasma, wherein the atmospheric plasma removes contaminants from the exposed portion of the surface of the seed layer to enable formation of an electrical connection to the conductive trace.

5. The method of claim 1, wherein the gas consists essentially of oxygen.

6. The method of claim 1, wherein the flexible circuit is produced by web processing and the surface of the flexible circuit is treated with the atmospheric plasma as the flexible circuit moves through the atmospheric plasma.

7. The method of claim 1, further comprising: directing gas into a second flow of gas, the second flow of gas flowing through a gas port separate from the first flow of gas and located between the first electrode and the flexible circuit.

8. A method of producing a flexible circuit, the method comprising:

directing a gas that is perpendicular to a surface of the flexible circuit, gas penetrating a first electrode configured to be located above the flexible circuit, wherein the flexible circuit includes a flexible metal substrate and a dielectric polymer layer disposed on the metal substrate;

depositing a seed layer on the dielectric polymer layer, wherein an opening is formed on the dielectric polymer layer to expose a portion of the flexible metal substrate;

covering a portion of the seed layer with a patterned photoresist layer;

electroplating a conductive metal onto portions of the seed layer not covered by the patterned photo-resist layer to form a plurality of conductive traces, wherein a first conductive trace of the plurality of conductive traces are formed in the opening of the dielectric polymer layer that establishes an electrical connection between the at least one conductive trace and the flexible metal substrate and a second conductive trace of the plurality of conductive traces is at least partially disposed over the dielectric polymer layer;

plating another conductive metal onto the plurality of conductive traces by electroless plating;

stripping away the patterned photoresist layer to expose the portion of the seed layer; etching away the exposed portion of the seed layer to expose a portion of a surface of the dielectric polymer layer;

forming a dielectric polymer coating over each of the plurality of conductive traces and at least part of the dielectric polymer layer such that a part of the dielectric polymer layer is exposed between conductive traces of the plurality of conductive traces;

applying an alternative voltage to the first electrode to generate a voltage differential between the first electrode and a second electrode connected to a ground, wherein the voltage differential creates an atmospheric plasma from the gas, the second electrode located below a web supporting the flexible circuit;

treating the surface of the flexible circuit the exposed portion of the surface of the dielectric polymer layer with the atmospheric plasma, wherein the atmospheric plasma removes conductive contaminants from the exposed portion of the surface of the dielectric polymer layer between adjacent conductive traces; and treating the surface of the flexible circuit with a beam of ions having a mean ion energy ranging from 500 electron volts to 1,500 electron volts, the second electrode supporting and propelling the web through the atmospheric plasma in a direction that is perpendicular to gas and the beam of ions.

9. The method of claim 8, further comprising: directing gas into a second flow of gas, the second flow of gas flowing through a gas port separate from the first flow of gas and located between the first electrode and the flexible circuit.

* * * * *